(12) United States Patent
Griswold et al.

(10) Patent No.: US 10,241,174 B2
(45) Date of Patent: *Mar. 26, 2019

(54) NUCLEAR MAGNETIC RESONANCE (NMR) FINGERPRINTING

(71) Applicant: Case Western Reserve University, Cleveland, OH (US)

(72) Inventors: Mark Griswold, Shaker Heights, OH (US); Nicole Seiberlich, Shaker Heights, OH (US); Dan Ma, Cleveland Heights, OH (US); Vikas Gulani, Shaker Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 1252 days.

This patent is subject to a terminal disclaimer.

(21) Appl. No.: 14/244,001

(22) Filed: Apr. 3, 2014

(65) Prior Publication Data

US 2014/0232399 A1 Aug. 21, 2014

Related U.S. Application Data

(63) Continuation of application No. 13/051,044, filed on Mar. 18, 2011, now Pat. No. 8,723,518.

(51) Int. Cl.
*G01R 33/54* (2006.01)
*G01R 33/56* (2006.01)
(Continued)

(52) U.S. Cl.
CPC ........... *G01R 33/543* (2013.01); *G01R 33/54* (2013.01); *G01R 33/56* (2013.01);
(Continued)

(58) Field of Classification Search
CPC ................ G01R 33/4828; G01R 33/50; G01R 33/5608; G01R 33/448; G01R 33/56341; G01R 33/543; G01R 33/54
See application file for complete search history.

(56) References Cited

U.S. PATENT DOCUMENTS

| 4,734,646 A | 3/1988 | Shenoy et al. |
| 5,500,592 A | 3/1996 | Bottomley |

(Continued)

FOREIGN PATENT DOCUMENTS

| CN | 1636508 A | 7/2005 |
| CN | 101208610 A | 6/2008 |

(Continued)

OTHER PUBLICATIONS

Doneva, et al., Accelerated MR Parameter Mapping Using Compressed Sensing with Model-Based Sparsifying Transform, Proc. Intl. Soc. Mag. Reson. Med., 2009, 17:2812.

(Continued)

*Primary Examiner* — Rishi R Patel
(74) *Attorney, Agent, or Firm* — Quarles & Brady LLP

(57) ABSTRACT

Apparatus, methods, and other embodiments associated with NMR fingerprinting are described. One example NMR apparatus includes an NMR logic configured to repetitively and variably sample a (k, t, E) space associated with an object to acquire a set of NMR signals. Members of the set of NMR signals are associated with different points in the (k, t, E) space. Sampling is performed with t and/or E varying in a non-constant way. The varying parameters may include flip angle, echo time, RF amplitude, and other parameters. The NMR apparatus may also include a signal logic configured to produce an NMR signal evolution from the NMR signals, a matching logic configured to compare a signal evolution to a known, simulated or predicted signal evolution, and a characterization logic configured to characterize a resonant species in the object as a result of the signal evolution comparisons.

15 Claims, 9 Drawing Sheets

(51) Int. Cl.
*G01R 33/48* (2006.01)
*G01R 33/50* (2006.01)
*G01R 33/563* (2006.01)

(52) U.S. Cl.
CPC .......... *G01R 33/4828* (2013.01); *G01R 33/50* (2013.01); *G01R 33/56341* (2013.01)

(56) References Cited

U.S. PATENT DOCUMENTS

| | | | |
|---|---|---|---|
| 5,903,150 | A | 5/1999 | Roznitsky |
| 6,392,408 | B1 | 5/2002 | Barrall et al. |
| 7,366,560 | B2 | 4/2008 | Taicher et al. |
| 7,642,775 | B2 | 1/2010 | Katscher et al. |
| 8,723,518 | B2 | 5/2014 | Seiberlich et al. |
| 9,097,781 | B2 | 8/2015 | Griswold |
| 2004/0189296 | A1 | 9/2004 | Sun et al. |
| 2004/0260173 | A1 | 12/2004 | Salerno et al. |
| 2005/0060112 | A1 | 3/2005 | Schafer et al. |
| 2007/0063702 | A1 | 3/2007 | Gerald, II et al. |
| 2007/0224696 | A1 | 9/2007 | Honkonen et al. |
| 2008/0077006 | A1 | 3/2008 | Katscher et al. |
| 2008/0278159 | A1 | 11/2008 | Park |
| 2008/0284433 | A1 | 11/2008 | Kraus, Jr. et al. |
| 2008/0309337 | A1 | 12/2008 | Gerald, II et al. |
| 2009/0136104 | A1* | 5/2009 | Hajian .............. G01R 33/56 382/128 |
| 2009/0232410 | A1 | 9/2009 | Dahnke et al. |
| 2010/0215239 | A1* | 8/2010 | Assaf .............. A61B 5/055 382/131 |
| 2010/0321017 | A1 | 12/2010 | Pines et al. |
| 2011/0140696 | A1 | 6/2011 | Yu |
| 2012/0001631 | A1 | 1/2012 | Espy et al. |
| 2012/0035851 | A1 | 2/2012 | Romero |
| 2013/0099786 | A1 | 4/2013 | Huang et al. |
| 2013/0265047 | A1 | 10/2013 | Griswold et al. |
| 2014/0266199 | A1 | 9/2014 | Griswold et al. |

FOREIGN PATENT DOCUMENTS

| | | |
|---|---|---|
| JP | H03109040 A | 5/1991 |
| JP | H07200300 A | 8/1995 |
| JP | 2009014700 A | 1/2009 |
| JP | 2012048706 A | 3/2012 |

OTHER PUBLICATIONS

Doneva, et al., Compressed Sensing Reconstruction for Magnetic Resonance Parameter Mapping, Magnetic Resonance in Medicine, 2010, 64:1114-1120.

Petzschner, et al., Fast MR Parameter Mapping Using k-t Principal Component Analysis, Magnetic Resonance in Medicine, 2011, 66(3):706-716.

Twieg, et al., Parsing Local Signal Evolution Directly From a Single-Shot MRI Signal: A New Approach for fMRI, Magnetic Resonance in Medicine, 2003, 50:1043-1052.

PCT International Search Report, PCT/US20131060681, dated Jan. 21, 2014.

"Courses in Experimental Chemistry 5, NMR", 4th Edition, Apr. 25, 1994, pp. 32-41, published by Maruzen Co., Ltd., Japan [No English Language Translation Available].

Ma, et al., MR Fingerprinting (MRF): A Novel Quantitative Approach to MRI, Proc. Intl. Soc. Mag. Reson. Med., 2012, 20:288.

Ma, et al., Magnetic Resonance Fingerprinting, Nature, 2013, 495:187-192.

McKenzie, et al., Analysis of Complex Mixtures Using High-Resolution Nuclear Magnetic Resonance Spectroscopy and Chemometrics, Progress in Nuclear Magnetic Resonance Spectroscopy, 2011, 59:336-359.

European Patent Office, Extended European Search Report, Application No. 13838364.1, dated Feb. 8, 2017.

* cited by examiner

NUCLEAR MAGNETIC RESONANCE (NMR) FINGERPRINTING

CROSS REFERENCE TO RELATED APPLICATIONS

This application is a continuation of U.S. patent application Ser. No. 13/051,044 filed Mar. 18, 2011.

BACKGROUND

Conventional magnetic resonance imaging (MRI) pulse sequences include a preparation phase, a waiting phase, and an acquisition phase that are configured to produce signals from which images can be made. The preparation phase determines when a signal can be acquired and determines the properties of the acquired signal. For example, a first pulse sequence may be designed to produce a T1-weighted signal at a first echo time (TE) while a second pulse sequence may be designed to produce a T2-weighted signal at a second TE. However, a lot of preparations and a lot of short waits, especially when compounded over multiple pulse sequences, can add up to a long time to make an image. These conventional pulse sequences are typically designed to provide qualitative results where images are acquired with various weightings or contrasts that highlight a particular parameter (e.g., T1 relaxation, T2 relaxation). These conventional pulse sequences are constrained by the fact that conventional MRI is focused mainly on producing images. Constraining NMR to techniques that facilitate producing images when the goal of an NMR inquiry is to determine relaxation parameters may not be appropriate.

A conventional MRI acquisition involves numerous repetitions of prepare/wait/acquire pulse sequences. For example, the first pulse sequence may be applied a large number of times to acquire T1 weighted signals for all voxels in a volume of interest (RoI) and then the second pulse sequence may be applied a large number of times to acquire T2 weighted signals for all the voxels in the RoI. Registering (e.g., aligning) the signals from these two acquisitions may be difficult. Regardless of how lengthy and how difficult the process, anyone who has had an MRI on a diseased hip joint knows that this repetitive application of prepare/wait/acquire pulse sequences can produce excellent and valuable diagnostic images, after about forty-five minutes "in the bore".

The images are viewed by a radiologist and/or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration. Thus, the images are only as good as the image interpreter and all image based (e.g., qualitative) diagnoses end up being subjective.

Seen from a different point of view, conventional MRI uses precise preparation time to create precise preparation conditions that facilitate acquiring precise signals from precise locations at precise points in time to make imprecise qualitative images. Conventional MRI attempts to force voxel contents (e.g., water, fat) to emit certain signals at certain times and then reconstructs images from these signals. But forcing Nature may not be the appropriate approach.

Regardless of these shortcomings, conventional MRI has served the clinical community well for many years. However, improved apparatus and methods may benefit from simply listening to Nature and recalling what Nature has told us in the past, rather than telling Nature when and how to speak.

Attempts have been made to listen to Nature, rather than to coerce Nature. For example, Twieg proposed an approach involving compressed sensing where a model of a signal was used to reduce the total amount of data needed to reconstruct a parameter map and then to reconstruct an image. Similarly, Doneva et al. proposed random under-sampling to achieve compressed sensing. In the Doneva approach, a pixel will represent its true signal evolution plus aliased signal from other pixels. In one embodiment, the aliasing will only appear as added noise at a pixel. The noise will not have structure and will not correlate to the true signal evolution. The Doneva approach facilitates performing a relatively simple process like Orthogonal Matching Pursuit (OMP) to resolve the correct signal to support image reconstruction. OMP assumes the presence of a constrained dictionary of expected signal evolutions. OMP compares a received signal to the dictionary of signals to identify the signal that was most likely to come from a pixel.

Twieg, *Parsing local signal evolution directly from a single-shot MRI signal: a new approach for fMRI*, Magn Reson Med 2003, November; 50(5):1043-52, describes a single-shot MRI method that performs single-shot parameter assessment by retrieval from signal encoding. The Twieg method abandons the fundamental simplifying assumption used in conventional MRI methods, that the local intrinsic signal does not change its amplitude or phase during signal acquisition, even though these changes may be substantial, especially during longer periods used in single-shot image acquisitions. Twieg recognized that, in reality, local decay and phase evolution occur and therefore modeled each signal datum as a sample from (k, t) space rather than k-space. Twieg adopted the more accurate view that each datum has its own location in a (k, t) space that also reflects another attribute (e.g., relaxation, decay), where t is the elapsed time. While Twieg anticipated improved accuracy and robustness due to the new signal model, intensive reconstruction computations limited Twieg's progress.

Doneva, et al., *Compressed sensing reconstruction for magnetic resonance parameter mapping*, Magnetic Resonance in Medicine, Volume 64, Issue 4, pages 1114-1120, October 2010, recognizes that different tissues in the human body can be distinguished in MRI by their intrinsic MR parameters including proton density, longitudinal (T1, spin-lattice) relaxation time, and transverse (T2, spin-spin) relaxation time. Doneva applies a learned dictionary to sparsify data and then uses a model based reconstruction for MR parameter mapping. Doneva identifies that "multiple relaxation components in a heterogeneous voxel can be assessed." However, Doneva uses an imaging based approach that relies on a library whose curves can, in one example, be characterized by equations of the form:

$$SE = 1 - 2e^{-1/Tx}$$

where:
SE is a signal evolution,
t is time, and
Tx is a single relaxation parameter.

In another, more general example, Doneva uses an imaging based approach that relies on a library whose curves can be characterized by:

$$SE = A + Be^{-t/C}$$

where A is a constant, B is a constant, t is time, and C is a single relaxation parameter.

The Doneva library is limited to the idealized, single relaxation parameter curves because the preparation is specific and constrained by the fact that Doneva ultimately reconstructs an image from the acquired data. Thus, any variations in t appear to be constant or linear and any variations in a also appear to be constant or linear.

While Twieg and Doneva certainly advanced the art, Twieg and Doneva appear to be limited to conventional imaging sequences that highlight only one or a few parameters. To the extent that Twieg or Doneva use any quantitative sequences, these sequences include an excitation and preparation scheme that generates a contrast between different tissues with different properties. However, the preparation fades over time until no more useful information can be acquired unless preparation is repeated. For example, after about 4-5 seconds, tissues subjected to an inversion recovery sequence designed for T1 contrast will have recovered to their equilibrium state and will yield no more signal. This short time limit compromises the ability to perform three dimensional imaging, imaging of moving targets, and so on. Additionally, Twieg and Doneva appear further limited to acquiring information associated with one relaxation parameter at a time. Twieg and Doneva appear suited to collecting information about T1 relaxation, T2 relaxation, or one fixed combination of T1 and T2, but not both simultaneously. To the extent that Twieg and Doneva could acquire information about T1 and T2, the sensitivity to either would be constant through the acquisition.

Therefore, while some attempts have been made to be less coercive in signal acquisition, conventional MRI still attempts to force certain signals at certain times to support assumptions required in conventional image reconstruction. Thus, Nature is still waiting for someone to simply listen and recall.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
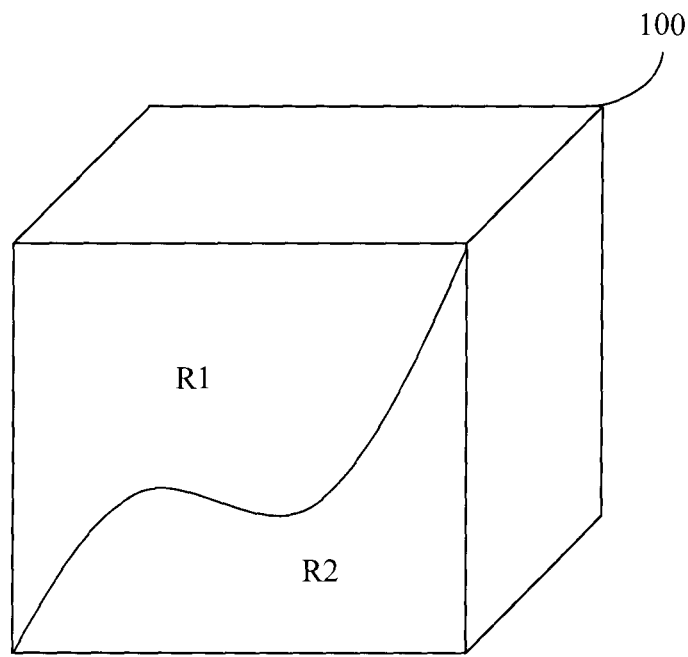
FIG. 1 illustrates a volume that contains two resonant species.

Example apparatus and methods do not try to force each resonant species containing area in an object to produce a desired signal at a desired time in response to specifically crafted preparation/wait/acquire sequences. Example apparatus and methods do not iterate through areas to be analyzed several times using identical specifically crafted preparation or excitation schemes to highlight individual parameters.

Instead, example apparatus and methods employ a series of varied sequence blocks that produce different signal evolutions in different resonant species (e.g., tissues) to which the RF is applied. The term "resonant species", as used herein, refers to an item (e.g., water, fat, tissue) that can be made to resonate using NMR. By way of illustration, when example apparatus and methods apply RF energy to a volume that has both bone and muscle tissue, then both the bone and muscle tissue will produce an NMR signal. However the "bone signal" and the "muscle signal" will be different. The different signals can be collected over a period of time to identify a signal evolution for the volume. Resonant species in the volume can then be characterized by comparing the signal evolution to known evolutions. The "known" evolutions may be, for example, simulated evolutions and/or previously acquired evolutions. Characterizing the resonant species can include identifying different relaxation parameters (e.g., T1, T2, diffusion resonant frequency).

Example apparatus and methods do not define what the signals produced by the resonant species must be, only that the signals be different between different resonant species being examined. Unlike conventional systems, the different NMR signals may not have constant signal strength or phase. Since tissues may produce different signals, the process of determining the relaxation parameters is reduced to pattern recognition in the signal time course. The pattern recognition may be performed using, for example, different variations of Orthogonal Matching Pursuit (OMP). Example apparatus and methods facilitate maximizing contrast between resonant species without ignoring resonant species that may be in the volume or object. Thus, NMR fingerprinting involves applying a series of varied sequence blocks that generates a particular signal evolution signature (e.g., fingerprint) that is specific for a particular combination of parameters and resonant species in a volume. Processing performed on received signals does not involve conventional reconstruction, but rather involves pattern recognition of the determined signal evolution.

To understand the difference between listening to Nature and trying to force Nature, let's revisit some fundamental basics of NMR. Larger objects like human bodies are made up of smaller objects like arms and legs and hips. The smaller objects are in turn made up of smaller parts like skin, muscle, fat, bone, tendon, and prosthetics. These smaller parts are in turn made up of even smaller things like water and minerals. The water and minerals are themselves made up of even smaller things (e.g., hydrogen, oxygen) which in turn are made up of even smaller things (e.g., electrons orbiting a nucleus). The nucleus may include a proton that exhibits "spin". A human body has a large number of protons and thus a large number of spins.

In the presence of a magnetic field, some of the spins will align in one direction (e.g., N/S) with respect to that magnetic field while other spins will align in an opposite direction (e.g., S/N) with respect to that magnetic field. Conventional MRI manipulates the magnetic field so that a net alignment in one direction is achieved. Conventional MRI further manipulates the magnetic field so that local differences in the field are achieved to allow spatial encoding. For example, x, y, and z gradients may be applied to create local variations in the larger magnetic field. The local variations allow the excitation of some spins without the excitation of other spins. Selective excitation is possible because of the Larmor relationship between magnetic fields and spins. The Larmor relationship describes how the frequency at which spins accept RF energy is related to the magnetic field in which the spins are located.

With the local variations created, RF energy may be applied to selected sets of spins associated with a local variation to make those spins behave in a certain way. For example, spins may be forced into a high energy state and forced away from their default alignment. When the RF energy is removed, the spins may return or may be forced to return to their default alignment. Different spins may return to their default alignment at different rates. Similarly, spins may return to their default alignment for different reasons. As the spins return from the forced alignment to the natural alignment, the spins produce a signal that can be detected for a short period of time. Conventional systems are limited by this short period of time and must, therefore, constantly repeat the process that tips the spins out of one alignment and into another alignment from which they can return and produce signal.

Like conventional MRI, NMR fingerprinting manipulates the magnetic field and manipulates the application of RF energy at different frequencies. However, example apparatus and methods use a comprehensive inquisitive signal acquisition approach as opposed to a one-at-a-time coercive approach. In one embodiment, NMR fingerprinting employs pseudo-random routines that allow a volume to produce the signal(s) the volume is going to produce in response to a variety of changing conditions created by a variety of changing applications of RF energy. NMR fingerprinting then compares a signal that evolves from the received signals to known signals received from other acquisitions at other times under similar conditions or to a set of simulated expected or predicted curves. If the received signal evolution matches or can be fit to within a threshold of a known, simulated, or predicted signal evolution, then the volume that generated the signal evolution likely holds the same number, type, and mixture of spins as the volume that produced that matched or fitted signal evolution. If relaxation parameters are available for the fitted or matched signal evolution, then conventional relaxation parameter determinations may be skipped.

The frequency at which water in a volume will accept RF energy is determined by the magnetic field in which the water is located. The frequency can be computed when the magnetic field is known. The frequency at which fat in the same volume will accept RF energy is also determined by the magnetic field in which the fat is located. This frequency can also be computed when the magnetic field is known. Thus, applying multiple frequencies can induce multiple resonant species to resonate. Applying the multiple frequencies under a series of different conditions at different times can cause the resonant species to resonate in different ways. Additionally, applying the multiple frequencies under different conditions at different times can cause the resonant species to resonate and relax in different ways. The different resonations and different relaxations may yield a unique signal evolution for a combination of resonant species.

If a volume only has water, then the volume will only produce one signal. If the volume only has fat, then the volume will also only produce one signal, but it will be a different signal. Different amounts of fat and water in the same volume will yield different signals. The combination of signals acquired under different conditions may yield nearly infinitely unique signal evolutions. While the human body is a complicated thing, from a certain point of view it is not that complicated. Every volume in a human body can only hold a finite set of things arranged in a finite set of ways. Over time, a comprehensive library of signal evolutions associated with many of the most relevant combinations of resonant species may be acquired and be available to NMR fingerprinting apparatus. The library may store known signals that may be referred to as baseline signatures or known signal evolutions. In different embodiments, the library may store simulated and/or predicted signal evolutions. Thus in different examples, "known" signal evolutions may include previously acquired signal evolutions and/or simulated signal evolutions.

In one embodiment, baseline signatures can be associated with materials that were analyzed solely for producing baseline signatures. For example, a beaker of water may be analyzed for a period of time using varied sequence blocks that produce a signal evolution. Similarly, a beaker of fat, a bone, a prosthetic hip, or other things that resonate may be analyzed, and signal evolutions retrieved from these items in response to applying selected combinations of varied sequence blocks over time under selected combinations of varied conditions. These signals may be used as baseline signatures for other objects that are analyzed.

In another embodiment, baseline signatures can be acquired from the object being analyzed. Volumes in the object may be imaged using a conventional technique and may also be subjected to NMR fingerprinting. For example, 1% of a leg may be imaged conventionally and also processed using example NMR fingerprinting to establish baseline signatures for bone and other tissues. The 1% may be processed to calibrate an apparatus or method. With the calibration and baseline signatures acquired, the remaining 99% may be analyzed using NMR fingerprinting that relies on the baseline signatures established by processing the 1%. Even if some volumes produce a signal for which no fingerprinting match can be made, those volumes may simply be imaged using a conventional approach. Thus, in one embodiment, a combination conventional and fingerprinting approach may be used to establish signatures and for calibration.

Using pattern matching to compare acquired signal evolutions to known signal evolutions may include analyzing a cross-correlation between signal evolutions of different tissues acquired using sequence blocks having different parameters. Ideally, a signal evolution would fit to exactly one member of the multi-dimensional set of known evolutions. One dimension of the multi-dimensional set could, for example, be associated with a first set of acquisition and/or excitation parameters while a second dimension of the multi-dimensional set could, for example, be associated with a second set of excitation and/or acquisition parameters. Over time, the members of the multi-dimensional set could be adapted based on fits that are achieved from live data. Over time, sequence blocks and/or combinations of sequence blocks that yield a more identity-matrix like result may be favored over sequence blocks that yield a matrix with more off-diagonal contributions. This adaptation of sequence blocks and/or series of sequence blocks based on observed results may contribute, for example, to calibrating a particular NMR apparatus for MRI fingerprinting.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

FIG. 1 illustrates a volume 100 (e.g., voxel) that contains two resonant species R1 and R2. R1 and R2 may have different relaxation parameters. For example, the $T1_{R1}$ may be less than $T1_{R2}$ while $T2_{R1}$ may be greater than $T2_{R2}$. Conventional systems may acquire a T1 weighted image and then acquire a T2 weighted image and then register the images. Example apparatus and methods apply RF energy in a series of varied sequence blocks that cause volume 100 to simultaneously produce different NMR signals from both R1 and R2. A signal evolution can be produced from these simultaneously produced different NMR signals. Relaxation parameters (e.g., T1, T2, PD) can be determined from the signal evolution through pattern matching to other signal evolutions for which relaxation parameters are known. The resonant species R1 and R2 can then be characterized by the relaxation parameters. Since different tissues have different known relaxation parameters, different tissues can be identified using the relaxation parameter characterization. While two resonant species are illustrated, one skilled in the art will appreciate that a volume may include a greater or lesser number of resonant species. Therefore, example methods and apparatus apply more generally to a volume having multiple resonant species.

Figure 2:
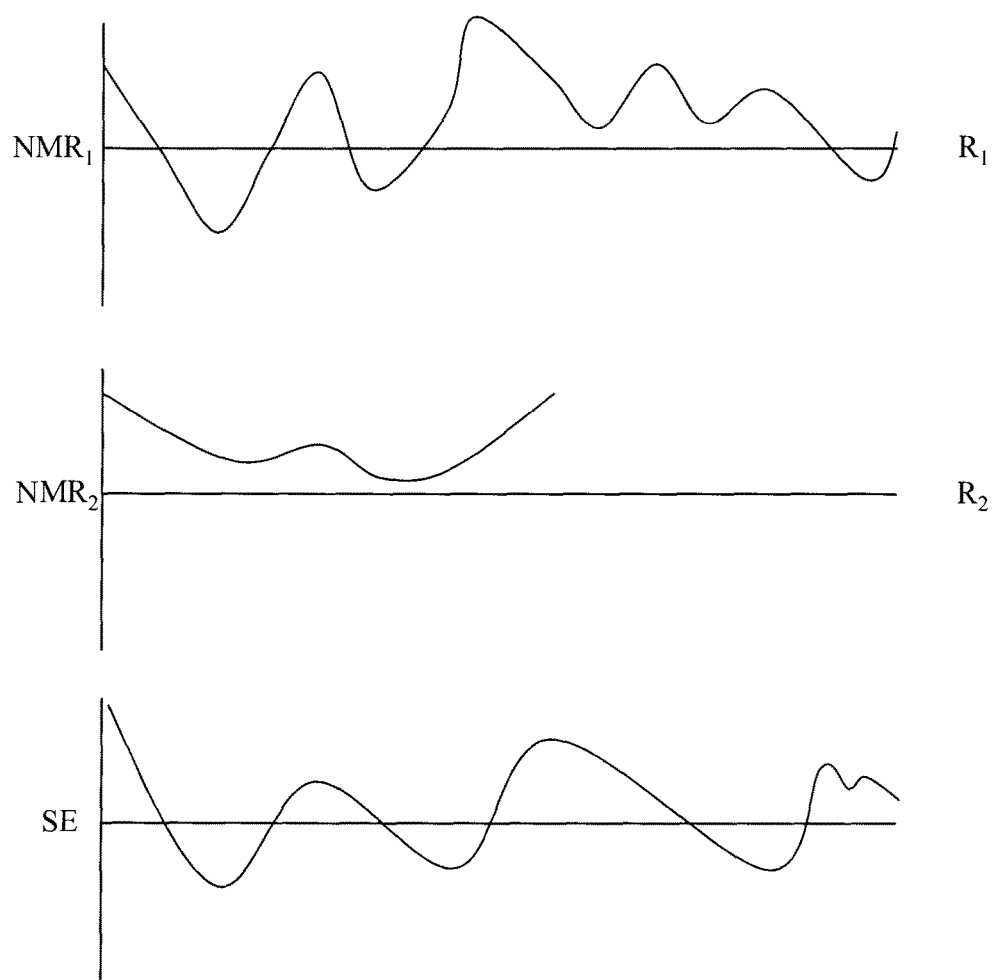
FIG. 2 illustrates two individual NMR signals received from two resonant species and a signal evolution derived from the two individual NMR signals.

FIG. 2 illustrates plots of two individual NMR signals $NMR_1$ and $NMR_2$ received from the two resonant species R1 and R2 in volume 100. $NMR_1$ includes data points generated by R1 under different conditions at different times. NMR$_2$ includes data points generated by R2 under the different conditions at the different times. Signal evolution SE results from NMR, and NMR$_2$ being generated and acquired simultaneously. The space from which the data points for NMR, and NMR$_2$ is acquired may be referred to as a (k, t, E) space, where in different examples, E refers to (T1, T2, D), (T1, T2, D, . . . ), (T1, T2, . . . ) where D refers to diffusion relaxation. In one example, both t and E may be non-linear. In another example, both t and E may be pseudo-random. Once again, while two plots associated with two resonant species are illustrated, one skilled in the art will appreciate that a volume may include a greater or lesser number of resonant species and thus may produce a greater or lesser number of signals. Therefore, example methods and apparatus apply more generally to a volume having one or more resonant species.

Figure 3:
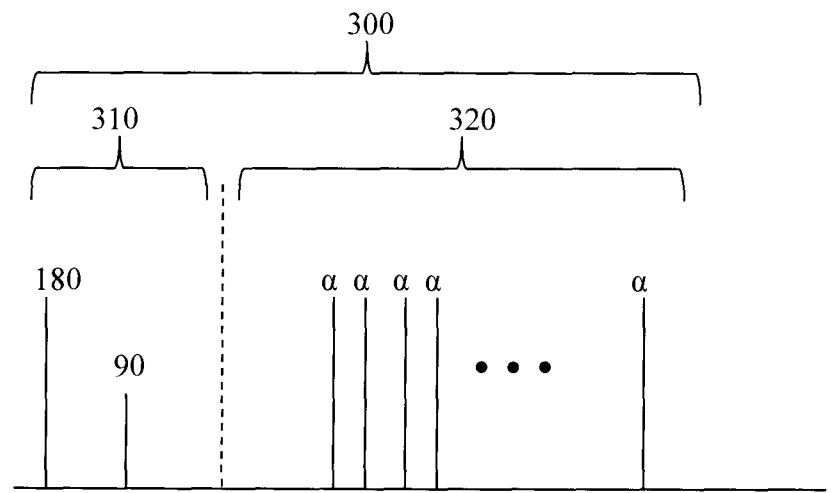
FIG. 3 compares and contrasts conventional sequence blocks to example sequence blocks.
Figure 3:
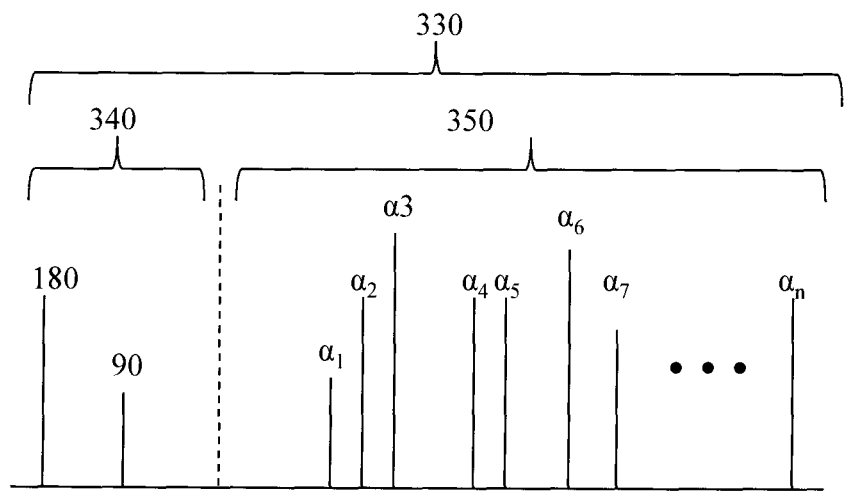

FIG. 3 compares and contrasts conventional sequence blocks to example sequence blocks. Sequence block 300 includes a preparation phase 310 and an acquisition phase 320. During acquisition phase 320, multiple acquisitions using the same flip angle and the same interval between acquisitions may be performed. Acquisition phase 320 resembles the Doneva approach, which acquires data from a (k, t) space, where t varies either constantly or linearly. The constant variation facilitates acquiring signal with constant amplitude and phase as required for conventional image reconstruction.

Sequence block 330 also includes a phase 340 and an acquisition phase 350. Notice that acquisition phase 350 is much longer than acquisition phase 320. Unlike acquisition phase 320 where parameters are either fixed or vary linearly, in acquisition phase 350 the parameters may vary widely, either non-linearly, randomly, and/or pseudo-randomly. Parameters that may vary include, but are not limited to, echo time, flip angle, phase encoding, and others. Note also that while phase 340 may, in some examples, be a preparation phase or preparation-like phase, that phase 340 does not necessarily perform a conventional image-centric preparation.

Figure 9:
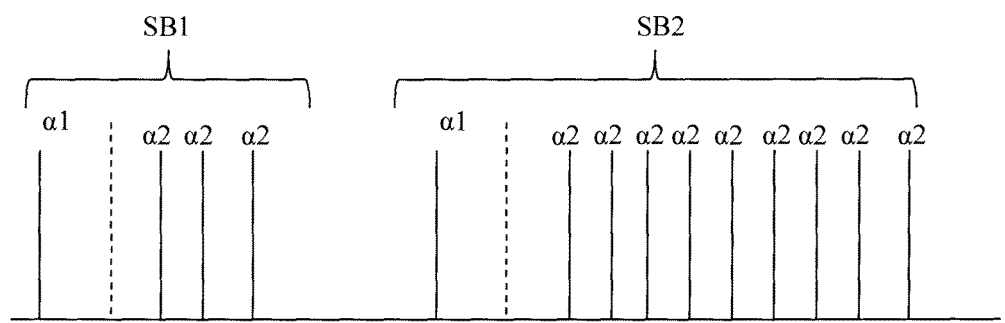
FIG. 9 illustrates another example set of sequence blocks.

FIG. 9 illustrates another example set of sequence blocks. In FIG. 9, a first sequence block SB1 has a first alpha pulse α1 and a series of identical α2 pulses. In FIG. 9, a second sequence block SB2 has the same first alpha pulse α1 and a different series of identical α2 pulses. The phase may be the same for the α2 pulses. Thus, in this example, the only difference between members of the set of sequence blocks is the number of α2 pulses. One skilled in the art will appreciate that other sets of sequence blocks may be employed.

Figure 4:
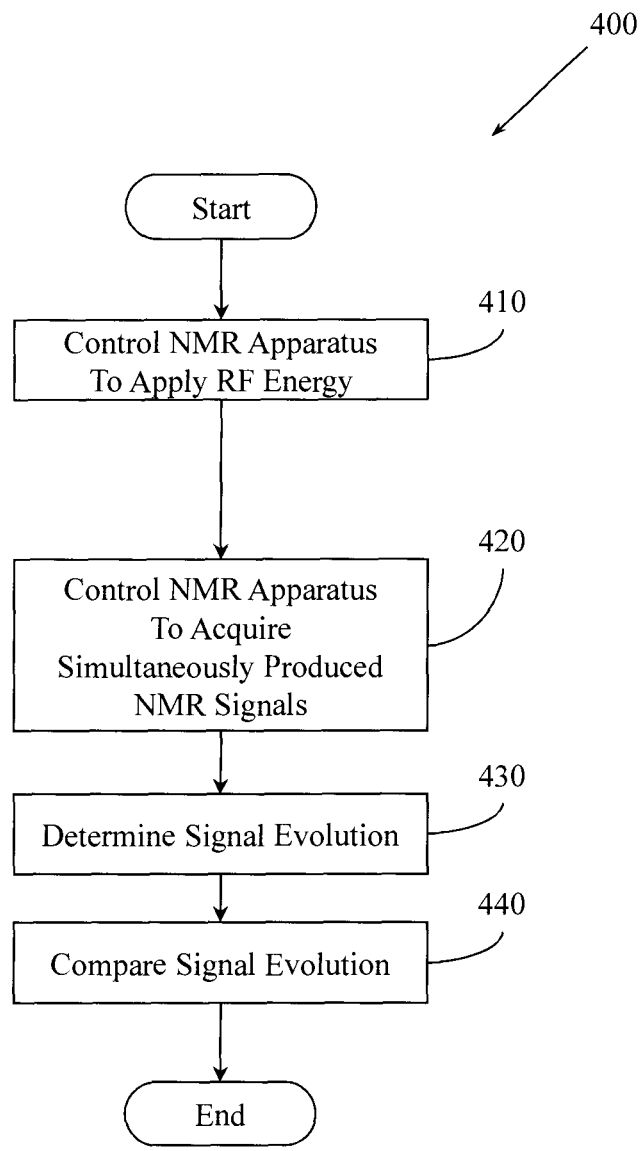
FIG. 4 illustrates an example method associated with NMR fingerprinting.

FIG. 4 illustrates a method 400 associated with NMR fingerprinting. Method 400 includes, at 410, controlling an NMR apparatus to apply RF energy to a volume in an object. The volume may contain one or more resonant species. In one embodiment, the object may be a human and thus resonant species may include, but are not limited to, tissue, fat, water, hydrogen, and prosthetics.

The RF energy may be applied in a series of variable sequence blocks. Sequence blocks may vary in a number of parameters including, but not limited to, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling. In different embodiments two, three, four, or more parameters may vary between sequence blocks. In different embodiments, the number of parameters varied between sequence blocks may itself vary. For example, A1 (sequence block 1) may differ from A2 in five parameters, A2 may differ from A3 in seven parameters, and A3 may differ from A4 in two parameters. One skilled in the art will appreciate that there are a nearly infinite number of series of sequence blocks that can be created by varying this large number of parameters. In one embodiment, a series of sequence blocks is crafted so that the series have different amounts (e.g., 1%, 2%, 5%, 10%, 50%, 99%, 100%) of unique sequence blocks as defined by their varied parameters. In different embodiments, a series of sequence blocks may include more than ten, more than one hundred, more than one thousand, more than ten thousand, and more than one hundred thousand sequence blocks. In one example, the only difference between consecutive sequence blocks may be the number of α2 pulses as illustrated in FIG. 9.

The RF energy applied during a sequence block is configured to cause different individual resonant species to simultaneously produce individual NMR signals. Unlike conventional systems, at least one member of the series of variable sequence blocks will differ from at least one other member of the series of variable sequence blocks in at least N sequence block parameters, N being an integer greater than one. As noted above, in different embodiments N may be a number greater than one. One skilled in the art will grasp that the signal content of a signal evolution may vary directly with N. Thus, as more parameters are varied, a potentially richer signal is retrieved. Conventionally, a signal that depends on a single parameter is desired and required to facilitate imaging. Here, acquiring signals with greater information content facilitates producing more distinct and thus more matchable signal evolutions.

In one embodiment, the NMR apparatus may be controlled at 410 to apply members of the series of variable sequence blocks according to a partially random acquisition plan configured to under-sample the object at an under-sampling rate R. In different embodiments, rate R may be, for example, two, four, or greater.

Method 400 also includes, at 420, controlling the NMR apparatus to acquire the simultaneously produced individual NMR signals. Unlike conventional systems where the time during which an imaging-relevant NMR signal can be acquired is severely limited (e.g., 4-5 seconds), the NMR apparatus can be controlled to acquire NMR signal for significantly longer periods of time. For example, the NMR apparatus can be controlled to acquire signal for up to ten seconds, for up to twenty seconds, for up to one hundred seconds, or longer. NMR signals can be acquired for longer periods of time because signal information content remains viable for longer periods of time in response to the series of varied RF energy applied at 410. In different embodiments, the information content in the signal evolution may remain above an information content threshold for at least five seconds, for at least ten seconds, for at least sixty seconds, or for longer. An information content threshold may describe, for example, the degree to which a subsequent signal acquisition includes information that can be retrieved and that differs from information acquired in a previous signal acquisition. For example, a signal that has no retrievable information would likely fall below an information content threshold while a signal with retrievable information that differs from information retrieved from a previous signal would likely be above the information content threshold.

Method 400 also includes, at 430, controlling the NMR apparatus to determine a signal evolution from the acquired NMR signals. Determining the signal evolution may include storing (k, t, E) space data points acquired during action 420. While an individual sequence block may yield a single point in (k, t, E) space, the signal evolution is determined by the series of variable sequence blocks. Over time, series of variable sequence blocks that yield particularly useful signal evolutions may be identified.

In one embodiment, the simultaneously produced signals are acquired at 420 over a first period of time and the signal evolution is determined at 430 over a second period of time. In different embodiments the first period of time may be ten seconds or longer, sixty seconds or longer, and even longer. Additionally, in different embodiments, the second period of time may be ten seconds or longer, sixty seconds or longer, and even longer.

Method 400 also includes, at 440, controlling the NMR apparatus to compare the signal evolution to one or more known, stored, simulated, and/or predicted signal evolutions. In different examples, the "stored" signal evolutions may include previously acquired signals, simulated signals, or both. In one embodiment, the stored signal evolutions are associated with signals not acquired from the object while in another embodiment the stored signal evolutions are associated with signals acquired from the object. In one embodiment, the stored signals may be associated with signals acquired from the object being analyzed and signals not acquired from the object being analyzed.

The stored signals may be associated with a potentially very large data space. Thus, one skilled in the art will appreciate that the stored signal evolutions may include signals outside the set of signal evolutions characterized by:

$$SE = A - Be^{-t/C}$$

where:
SE is a signal evolution,
A is a constant,
B is a constant,
t is time, and
C is a single relaxation parameter.

Indeed, one skilled in the art will appreciate that the very large data space for the stored signal evolutions can be partially described by:

$$SE = \prod_{i=1}^{N_A} \prod_{j=1}^{N_{RF}} R_i(\alpha) R_{RF_{ij}}(\alpha, \varphi) R(G) E_i(T1, T2, D)$$

where:
SE is a signal evolution,
$N_A$ is a number of sequence blocks,
$N_{RF}$ is a number of RF pulses in a sequence block,
α is a flip angle,
ϕ is a phase angle,
Ri(α) is a rotation due to off resonance,
$R_{RF_{ij}}$(α, ϕ) is a rotation due to RF differences,
R(G) is a rotation due to a gradient,
T1 is spin-lattice relaxation,
T2 is spin-spin relaxation,
D is diffusion relaxation, and
$E_i$(T1, T2, D) is decay due to relaxation differences.

While $E_i$(T1, T2, D) is provided as an example, one skilled in the art will appreciate that in different embodiments, $E_i$(T1, T2, D) may actually be $E_i$(T1, T2, D, . . . ), or $E_i$(T1, T2, . . . ).

In one example, the summation on j could be replaced by a product on j, eg.:

$$SE = \prod_{i=1}^{N_A} \prod_{j=1}^{N_{RF}} R_i(\alpha) R_{RF_{ij}}(\alpha, \varphi) R(G) E_i(T1, T2, D)$$

In NMR, MRI, or ESR (electron spin resonance), a Bloch equation is a member of a set of macroscopic equations that are used to calculate the nuclear magnetization M=($M_x$, $M_y$, $M_z$) as a function of time when relaxation times $T_1$ and $T_2$ are present. These phenomenological equations were introduced by Felix Bloch and may also be referred to as the equations of motion of nuclear magnetization. One skilled in the art will appreciate that in one embodiment Ri(α), $R_{RF_{ij}}$ (α, ϕ), and R(G) may be viewed as Bloch equations.

While FIG. 4 illustrates various actions occurring in serial, it is to be appreciated that various actions illustrated in FIG. 4 could occur substantially in parallel. By way of illustration, a first process could control applying RF energy, a second process could control acquiring NMR signals and determining a signal evolution, and a third process could perform signal evolution comparisons. While three processes are described, it is to be appreciated that a greater and/or lesser number of processes could be employed.

Figure 5:
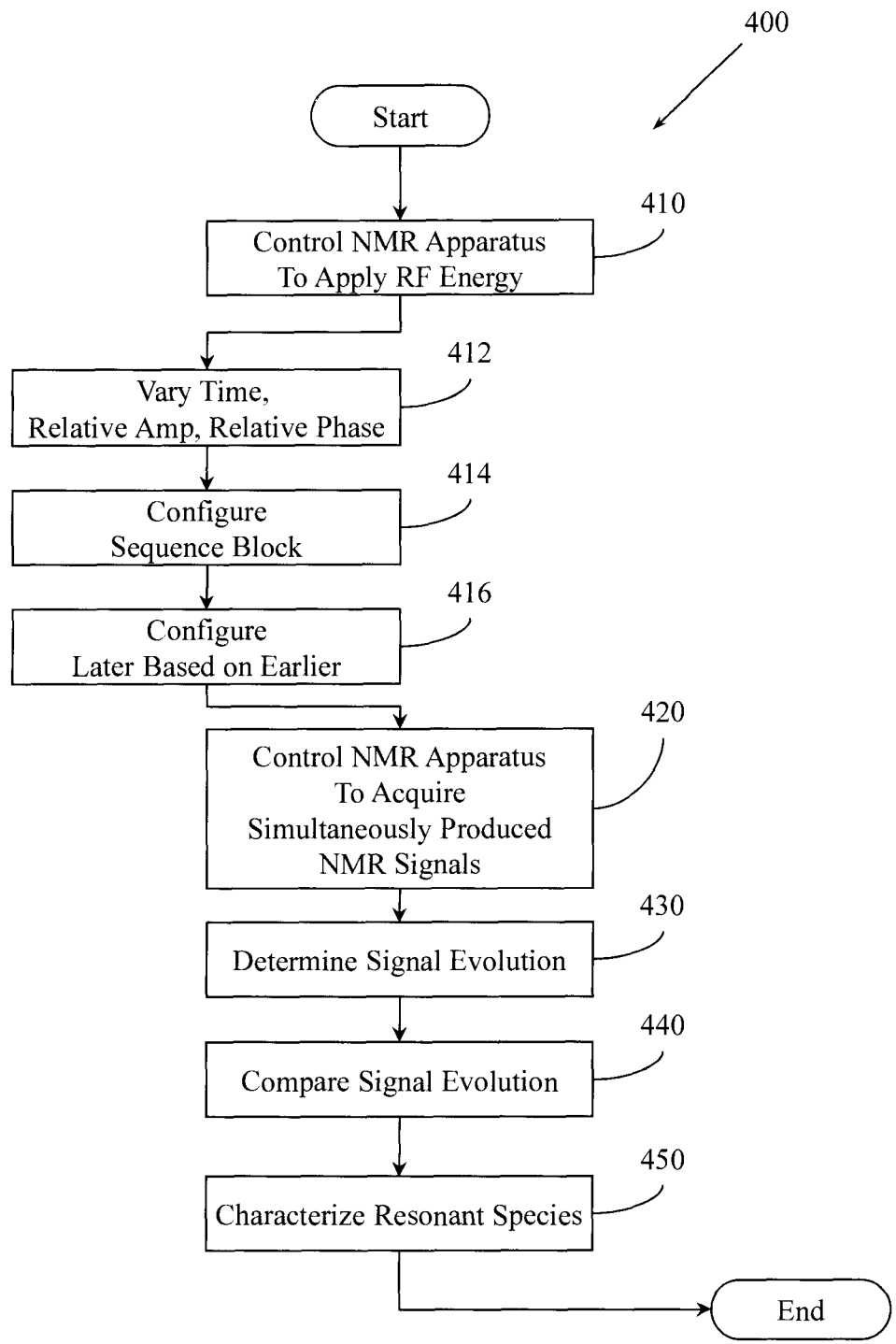
FIG. 5 illustrates an example method associated with NMR fingerprinting.

FIG. 5 illustrates another embodiment of method 400 (FIG. 4). This embodiment includes actions 410, 420, 430, and 440. However, this embodiment also includes actions 412, 414, 416, and 450.

This embodiment of method 400 includes, at 412, controlling the NMR apparatus to vary one or more of, the amount of time between sequence blocks, the relative amplitude of sequence blocks, and the relative phase of sequence blocks. Thus, not only can the individual parameters (e.g., flip angle, phase) be varied between sequence blocks, but the times between sequence blocks and other differences between sequence blocks can be varied. This facilitates creating additional signal content in the signal evolution.

This embodiment of method 400 also includes, at 414, controlling the NMR apparatus to configure a member of the series of variable sequence blocks as one of, a TrueFISP pulse sequence, a FLASH pulse sequence, and a TSE pulse sequence. Action 414 illustrates that a set of sequence blocks is not necessarily the same thing as a conventional imaging-based pulse sequence. A sequence block differs from a conventional pulse sequence for at least the reason that non-linearly varying Δt and ΔE, which produce NMR signals in (k, t, E) space having non-constant amplitudes and phases are encouraged, not prohibited.

This embodiment of method 400 also includes, at 416, controlling the NMR apparatus to configure a later member of the series of variable sequence blocks based, at least in part, on an NMR signal acquired in response to applying an earlier member of the series of variable sequence blocks. Thus, this embodiment of method 400 is an adaptive method where the order of members of the series of varied sequence blocks may not be known ahead of time. Instead, as data points in (k, t, E) space are acquired, and as a signal evolves, decisions concerning different sequence blocks and different sets of parameters to vary may be made. By way of illustration, a first number of data points in (k, t, E) space and an evolving signal may be leading towards one relaxation parameter determination and away from another relaxation parameter determination. Therefore, sequence blocks that can confirm and/or reject either of these leads may be applied next in the series to facilitate a guided and more rapid convergence in the pattern matching process.

This embodiment of method 400 also includes, at 450, controlling the NMR apparatus to characterize at least one of the resonant species as a function of comparing the signal evolution to one or more stored (e.g., known, simulated, predicted) signal evolutions. Comparing the acquired signal evolution to a stored signal evolution may include, for example, controlling the NMR apparatus to compare the signal evolution to members of a multi-dimensional set of NMR signal evolutions. A first dimension in the multi-dimensional set may be associated with a first set of sequence block parameters and a second dimension in the multi-dimensional set may be associated with a second, different set of sequence block parameters. Since a signal evolution evolves over time, the multi-dimensional set may include a time dimension and the pattern matching process may include a path matching process that monitors the progress of the signal evolution. Additionally, since one series of varied sequence blocks may differ from another series of varied sequence blocks, the multi-dimensional set may include an order dimension where once again the pattern matching process may path match as opposed to just pattern matching.

Characterizing a resonant species may include, for example, identifying relaxation parameters including, but not limited to, T1 relaxation associated with the resonant species, T2 relaxation associated with the resonant species, off-resonance relaxation associated with the resonant species, and diffusion weighted relaxation associated with the resonant species.

Figure 6:
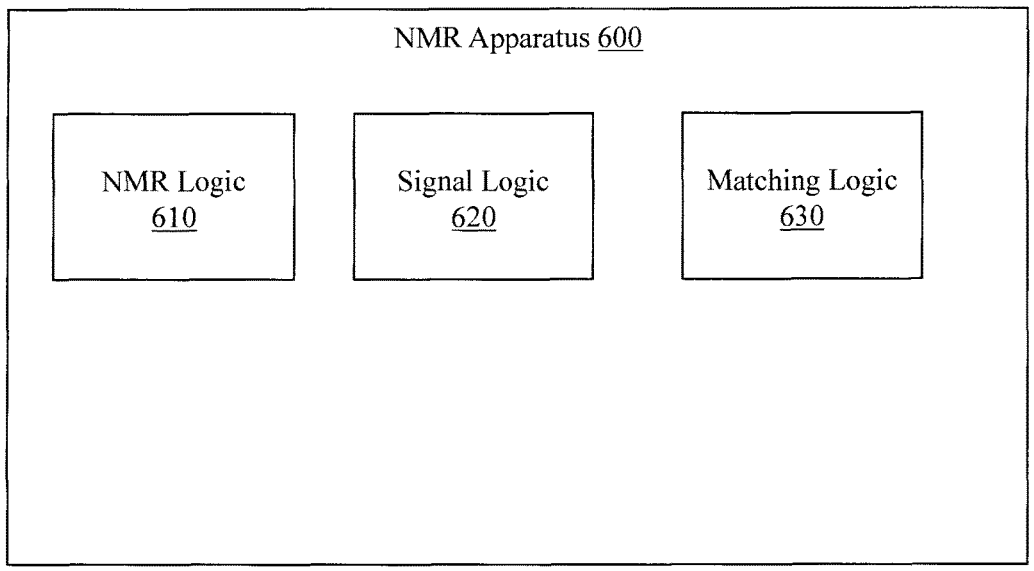
FIG. 6 illustrates an example apparatus associated with NMR fingerprinting.

FIG. 6 illustrates an NMR apparatus 600. NMR apparatus 600 includes an NMR logic 610. NMR logic 610 is configured to repetitively and variably sample an object in a (k, t, E) space to acquire a set of NMR signals that may have non-constant amplitude and/or phase. Members of the set of NMR signals are associated with different points in the (k, t, E) space. In different embodiments the different points are sampled according to a plan where t and/or E varies non-linearly and/or in a non-constant manner.

NMR apparatus 600 also includes a signal logic 620. Signal logic 620 is configured to produce an NMR signal evolution from the NMR signals. The signal evolution may include a number of NMR signals acquired over a period of time.

NMR apparatus 600 also includes a matching logic 630. Matching logic 630 is configured to compare the produced NMR signal evolution to a known NMR signal evolution. The known NMR signal evolution may be, for example, a previously acquired signal evolution, or a simulated signal evolution.

Figure 7:
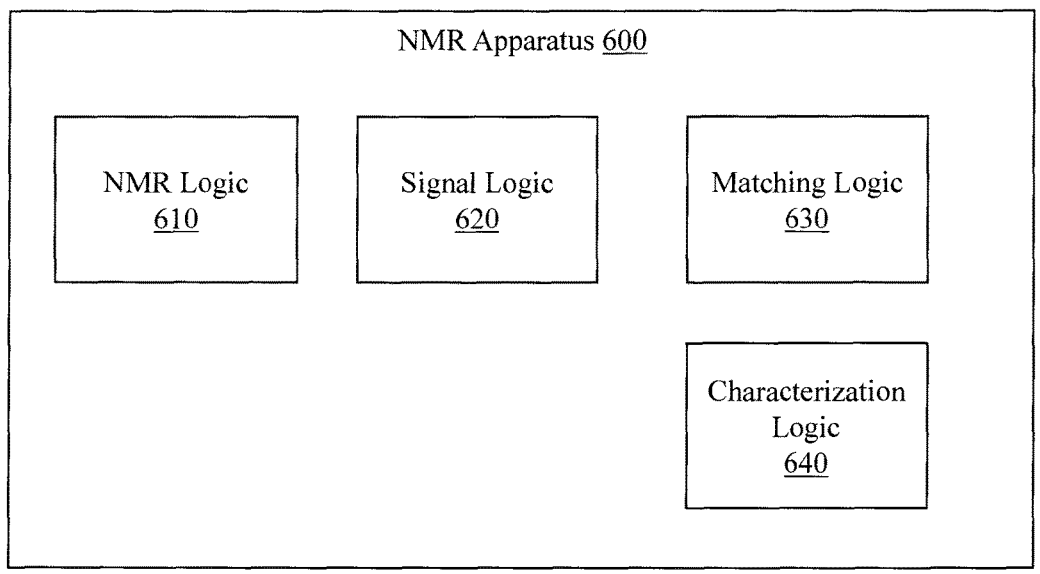
FIG. 7 illustrates an example apparatus associated with NMR fingerprinting.

FIG. 7 illustrates another embodiment of apparatus 600 (FIG. 6). This embodiment of apparatus 600 includes a characterization logic 640. Characterization logic 640 is configured to characterize a resonant species in the object by comparing the NMR signal evolution to a characterizing signal evolution(s). Characterizing the resonant species may include identifying relaxation parameters including, but not limited to, T1 relaxation, T2 relaxation, diffusion weighted relaxation, and off-resonance relaxation. The characterizing signal evolution(s) may be stored in a library of characterizing signal evolutions.

Figure 8:
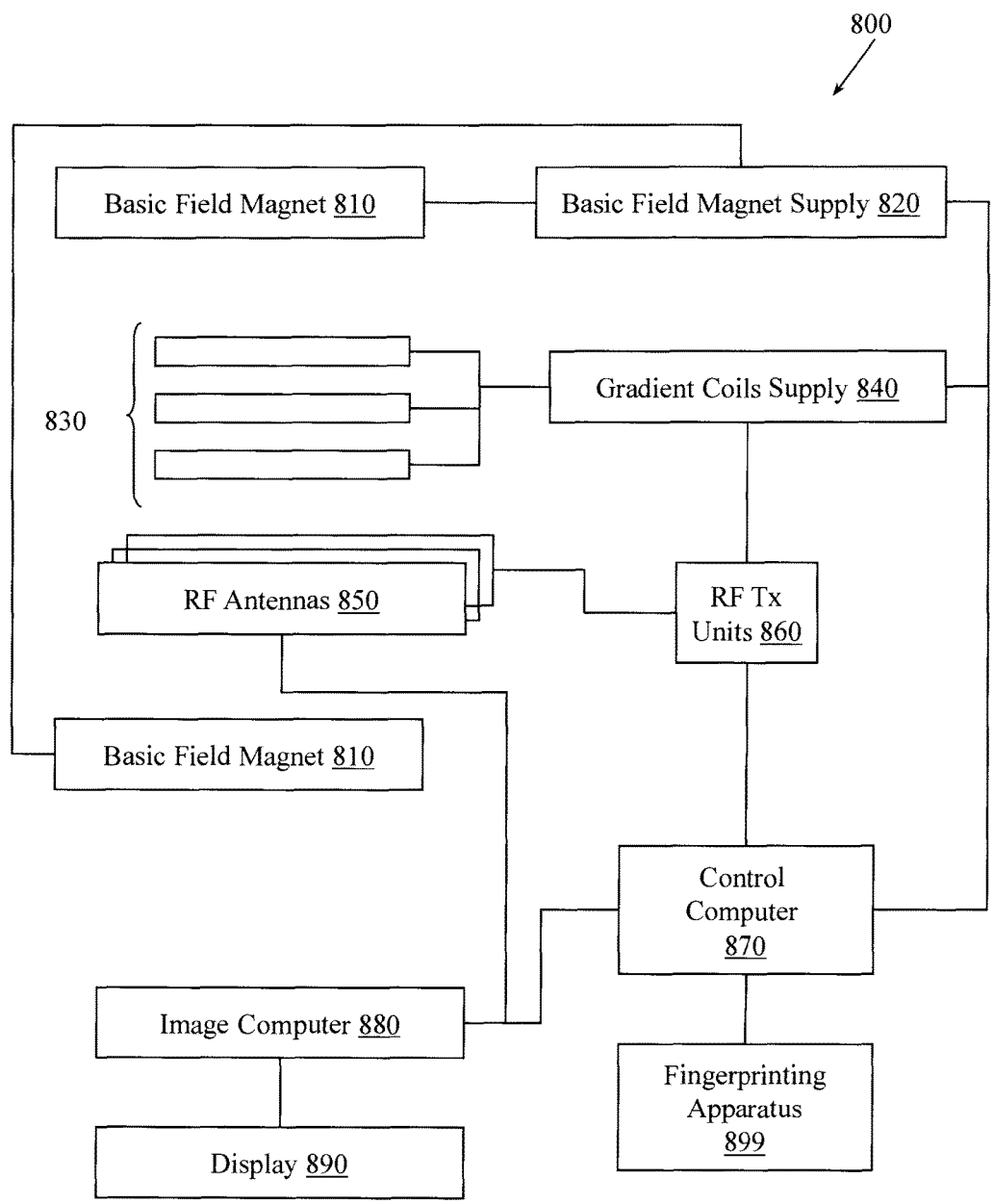
FIG. 8 illustrates an MRI apparatus configured to perform NMR fingerprinting.

FIG. 8 illustrates an example MRI apparatus 800 configured with a fingerprinting apparatus 899 to facilitate MRI fingerprinting. The fingerprinting apparatus 899 may be configured with elements of example apparatus described herein and/or may perform example methods described herein.

The apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being imaged by the MRI apparatus 800. MRI apparatus 800 may include gradient coils 830 configured to emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted, during an MRI procedure.

MRI apparatus 800 may include a set of RF antennas 850 that are configured to generate RF pulses and to receive resulting nuclear magnetic resonance signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control an NMR device as described herein. Conventionally, the magnetic resonance signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890.

However, fingerprinting apparatus 899 facilitates not having to do conventional reconstruction of an image from MR signals received from the RF antennas 850. Thus the RF energy applied to an object by apparatus 800 need not be constrained to produce signals with substantially constant amplitudes or phases. Instead, fingerprinting apparatus 899 facilitates matching received signals to known signals for which a reconstruction, relaxation parameter, or other information is already available. This facilitates producing a quantitative result.

While FIG. 8 illustrates an example MRI apparatus 800 that includes various components connected in various ways, it is to be appreciated that other MRI apparatus may include other components connected in other ways.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method, comprising:
controlling a nuclear magnetic resonance (NMR) apparatus to apply radio frequency (RF) energy to a volume in an object in a series of variable sequence blocks, where a sequence block includes one or more excitation phases, one or more readout phases, and one or more waiting phases,
where the volume contains one or more resonant species,
where the RF energy applied during a sequence block is configured to cause the one or more resonant species in the volume to simultaneously produce individual NMR signals, and
where at least one member of the series of variable sequence blocks differs from at least one other member of the series of variable sequence blocks in at least N sequence block parameters, N being an integer greater than one;
controlling the NMR apparatus to acquire the simultaneously produced individual NMR signals;
controlling the NMR apparatus to compare the acquired NMR signals to one or more known signal evolutions, and
controlling the NMR apparatus to characterize at least one of the resonant species as a function of comparing the acquired NMR signals to the one or more known signal evolutions, where characterizing the resonant species comprises identifying one or more of, T1 relaxation associated with the resonant species, T2 relaxation associated with the resonant species, off-resonance relaxation associated with the resonant species, and diffusion weighted relaxation associated with the resonant species,
where the known signal evolutions include a signal selected from a set of signals described by:

$$SE = \sum_{s=1}^{N_S} \prod_{i=1}^{N_A} \prod_{j=1}^{N_{RF}} R_i(\alpha) R_{RF_{ij}}(\alpha, \phi) R(G) E_i(T1, T2, D) M_0 \text{ or}$$

-continued $$SE = \sum_{s=1}^{N_S} \prod_{i=1}^{N_A} \prod_{j=1}^{N_{RF}} R_i(\alpha) R_{RF_{ij}}(\alpha, \phi) R(G) E_i(T1, T2, D) M_0$$

where:
SE is a signal evolution,
$N_S$ is a number of spins,
$N_A$ is a number of sequence blocks,
$N_{RF}$ is a number of RF pulses in a sequence block,
$\alpha$ is a flip angle,
$\phi$ is a phase angle,
$R_i(\alpha)$ is a rotation due to off resonance,
$R_{RF_{ij}}(\alpha, \phi)$ is a rotation due to RF differences,
$R(G)$ is a rotation due to a gradient,
T1 is spin-lattice relaxation,
T2 is spin-spin relaxation,
D is diffusion relaxation,
$E_i(T1, T2, D)$ is decay due to relaxation differences, and
$M_0$ is the default or natural alignment to which spins align when placed in the main magnetic field.

2. The method of claim 1, where the sequence block parameters comprise echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling.

3. The method of claim 2, where the sequence block parameters are selected from the group including echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling.

4. The method of claim 3, comprising:
controlling the NMR apparatus to vary one or more of, the amount of time between sequence blocks in the series of variable sequence blocks, the relative amplitude of RF pulses in sequence blocks in the series of variable sequence blocks, and the relative phase of RF pulses in sequence blocks in the series of variable sequence blocks.

5. The method of claim 4, comprising controlling the NMR apparatus to configure a member of the series of variable sequence blocks as one of, a TrueFISP pulse sequence, a FLASH pulse sequence, and a TSE pulse sequence.

6. The method of claim 5, where at least one percent of the members of the series of variable sequence blocks are unique.

7. The method of claim 6, where at least ten percent of the members of the series of variable sequence blocks are unique.

8. The method of claim 7, comprising:
controlling the NMR apparatus to configure a later member of the series of variable sequence blocks based, at least in part, on an NMR signal acquired in response to applying an earlier member of the series of variable sequence blocks.

9. The method of claim 8, the object being an animal and the one or more resonant species comprising an animal tissue, water, and fat.

10. The method of claim 9, comprising:
controlling the NMR apparatus to apply members of the series of variable sequence blocks according to a partially random acquisition plan configured to under-sample the object at an under-sampling rate R.

11. The method of claim 10, where the rate R is greater than two.

12. The method of claim 1, where the signal evolutions include signals outside the set of signal evolutions characterized by:

$$Se = A - Be^{-t/C}$$

where:
SE is a signal evolution,
A is a constant,
B is a constant,
t is time, and
C is a single relaxation parameter.

13. The method of claim 1, where controlling the NMR apparatus to characterize at least one of the resonant species as a function of comparing the acquired NMR signals to one or more known signal evolutions comprises:
controlling the NMR apparatus to compare the acquired NMR signals to members of a multi-dimensional set of NMR signal evolutions,
where a first dimension in the multi-dimensional set is associated with a first set of sequence block parameters, and
where a second dimension in the multi-dimensional set is associated with a second, different set of sequence block parameters.

14. The method of claim 1, where signal content of the acquired NMR signals varies directly with N.

15. The method of claim 1, where information content in the acquired NMR signals remains above an information content threshold for at least 5 seconds.

* * * * *